United States Patent
Kim et al.

(10) Patent No.: US 9,705,457 B2
(45) Date of Patent: Jul. 11, 2017

(54) HIGH SPEED SIGNAL LEVEL DETECTOR AND BURST-MODE TRANS IMPEDANCE AMPLIFIER USING THE SAME

(71) Applicant: ELECTRONICS AND TELECOMMUNICATIONS RESEARCH INSTITUTE, Daejeon-si (KR)

(72) Inventors: Young Ho Kim, Sejong-si (KR); Sang Soo Lee, Daejeon-si (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 14/875,893

(22) Filed: Oct. 6, 2015

(65) Prior Publication Data

US 2016/0142028 A1 May 19, 2016

(30) Foreign Application Priority Data

Nov. 14, 2014 (KR) ........................ 10-2014-0159089

(51) Int. Cl.
*H03K 5/153* (2006.01)
*H03F 3/45* (2006.01)
(Continued)

(52) U.S. Cl.
CPC ......... *H03F 3/45183* (2013.01); *G01R 19/04* (2013.01); *H03F 3/082* (2013.01); *G01R 19/0084* (2013.01); *H03F 2200/435* (2013.01)

(58) Field of Classification Search
CPC .. G01R 19/04; G01R 19/0038; H03K 5/1532; H03K 5/082; G11B 20/10009
(Continued)

(56) References Cited

U.S. PATENT DOCUMENTS 7,109,466 B2   9/2006   Park et al.
7,206,521 B2   4/2007   Doh et al.
(Continued)

FOREIGN PATENT DOCUMENTS

KR   100575981 B1   4/2006
KR   100703428 B1   3/2007
(Continued)

OTHER PUBLICATIONS

Hwang-Cherng Chow, et al; "A High Performance Peak Detector Sample and Hold Circuit for Detecting Power Supply Noise", Published in: Circuits and Systems, 2008. APCCAS 2008. IEEE Asia Pacific Conference on Nov. 30, 2008-Dec. 3, 2008; pp. 672-675.

*Primary Examiner* — Quan Tra
(74) *Attorney, Agent, or Firm* — Ladas & Parry LLP

(57) ABSTRACT

A signal level detector comprising and a Burst-Mode Trans Impedance Amplifier (BM-TIA) using the same. The signal level detector includes a level detector configured to detect peak voltage of an input voltage signal, a reference voltage generator configured to generate second reference voltage by receiving first reference voltage, a comparator configured to compare the peak voltage and the second reference voltage and output a discrimination value according to a comparison result, and a latch configured to store the differential output from the comparator, wherein the level detector and the reference voltage generator have differential amplifier in the same structure.

11 Claims, 8 Drawing Sheets

(51) Int. Cl.
*H03F 3/08* (2006.01)
*G01R 19/04* (2006.01)
*G01R 19/00* (2006.01)

(58) Field of Classification Search
USPC .................................................. 327/58, 77
See application file for complete search history.

(56) References Cited

U.S. PATENT DOCUMENTS

| | | |
|---|---|---|
| 7,479,808 B2 * | 1/2009 | Groiss .............................. 327/74 |
| 7,898,300 B2 | 3/2011 | Lim |
| 8,310,277 B2 | 11/2012 | Su et al. |
| 8,497,711 B2 * | 7/2013 | Hsieh .............................. 327/58 |
| 2005/0238014 A1 | 10/2005 | Kang |
| 2009/0134913 A1 * | 5/2009 | Hsiung et al. .................. 327/58 |
| 2010/0135665 A1 | 6/2010 | Lee et al. |
| 2011/0129235 A1 * | 6/2011 | Le et al. ........................ 398/208 |

FOREIGN PATENT DOCUMENTS

| | | |
|---|---|---|
| KR | 100813462 B1 | 3/2008 |
| KR | 101362507 B1 | 2/2014 |

* cited by examiner

HIGH SPEED SIGNAL LEVEL DETECTOR AND BURST-MODE TRANS IMPEDANCE AMPLIFIER USING THE SAME

CROSS-REFERENCE TO RELATED APPLICATION(S)

This application claims priority from Korean Patent Application No. 10-2014-0159089, filed on Nov. 14, 2014, in the Korean Intellectual Property Office, the entire disclosure of which is incorporated herein by reference for all purposes.

BACKGROUND

1. Field

The following description relates to a technology for detecting signal level on an electronic circuit, and, more particularly, to a technology for detecting signal level quickly and a technology for actively controlling gain of a Trans Impedance Amplifier (TIA) by associating a signal level detector with the TIA.

2. Description of the Related Art

A technology of detecting a signal level is essential for detecting or restoring data without an error in accordance with a change in a level of a wide-range input signal. Thus, this kind of technology is applied widely to a system for receiving a wide dynamic range signal, such as a wired/wireless communication system, a measurement equipment, a bio healthcare and medical device, and a disk drive.

The technology of detecting a signal level provides various key functions, such as detecting or restoring data, by applying an Automatic Gain Control (AGC) with a peak detector to automatically control gain corresponding to a change in a level of an input signal. In particular, a point-to-multi-point (P2MP) Passive Optical Network (PON) is configured in an optical communication system, optical packet signals from multiple subscribers have different path loss values and thus consist of burst signals with different signal levels. In this case, in order to restore a burst packet receipt signal without data distortion, the burst packet receipt signal whose level is constantly changed at predetermined time intervals, a receiver in a base station essentially needs to have a Burst-Mode Trans Impedance Amplifier (BM-TIA).

In general, in order to detect a peak value of a signal, a rectifier as shown in FIG. 1 is used. FIG. 1 is a diagram illustrating a configuration of a general rectifier having a passive device.

Referring to FIG. 1, a diode D 10 is configured in a manner where forward current flows from $V_{peak}$ node toward $V_s$ node and reverse current from $V_{peak}$ node toward $V_s$ node are blocked. Using a characteristic of the diode D 10 that lets current flow in one way, constant voltage is retained through a capacitor C1 12 and a resistance 14 for a predetermined time period so as to detect a peak value of a signal.

FIG. 2 is a diagram illustrating a peak detector used in a general integrated circuit for high-speed data processing.

Referring to FIG. 2, a peak detector includes an amplifier 20 that consists of a current source and transistors $M_1$, $M_2$, $M_3$, and $M_4$. The amplifier 20 has a positive node and a negative node, wherein an input signal is input (In) to the positive input node and the negative node has a negative feedback loop circuit configured therein. In the negative feedback loop circuit, output of the amplifier 20 is provided as an in-phase value that is source followed through a rectifier consisting of a diode $D_1$ 21 and a capacitor $C_{hold}$ 22.

To reduce an error between two inputs, the amplifier 20 constantly compares the two inputs and amplifies a differential therebetween. As a result, through a buffered rectifier output, signal peak values are obtained.

The structures described with reference to FIGS. 1 and 2 are stable but may cause various problems in an optical communication system, such as a Next Generation Passive Optical Network 2 (NG-PON2), which needs to extract a signal level as fast as possible within a few ns~tens of ns.

The first problem is caused by a frequency characteristic of a diode used for rectifying a signal. A rectifier diode seems to usually act as a capacitor component in an optical communication clock frequency at a multi-Gbps. It means that the rectifier diode is unable to perform a forward rectifying function at a low frequency. Even a schottky barrier, which is used for high-frequency operations, is unable to normally perform a rectifying function in an optical communication clock frequency, so that it takes a great deal of time to detect a peak value of a signal.

FIG. 3 is a simulation result graph regarding comparison in terms of a frequency characteristic and a transient characteristic in the case where a rectifier consists of a general diode used for an integrated circuit and a schottky barrier diode.

Referring to FIG. 3, both of the general diode and the schottky barrier diode are at −3 dB, which is a low frequency (within 1 MHz), showing characteristics of a Low Pass Filter (LSP); however, at a much lower frequency, the both reach to zero where gain attenuation does not occur. It means that if a multi-Gbps clock signal is input, the signal is a bit attenuated but able to pass.

Regarding the transient characteristic, the signal is able to be output in a manner described above. It may be found that, in the case where an output value is a few ns~tens of ns, both of a general diode and a schottky barrier diode are not able to reach a peak value of a signal and a great deal of time is required to detect the peak value. Thus, it is hard to apply a rectifier using a diode to a multi-Gbps optical communication system.

The second problem is related with the fact that burst packet signals with different levels are input to a P2MP optical communication system every hour. To address the situation, a preamble signal exists for a predetermined time period before actual data is put. The preamble signal is a high-speed clock switching between 0 and 1, and gain may be controlled by detecting a signal level for the predetermined time period. Using the peak detector configured to include an amplifier and a rectifier, as shown in FIG. 2, the maximum level of a detected signal may be only half an average level of an input signal. It is because an average between 0 and 1 is obtained due to charging and discharging of a parasite capacitor component. As a result, a level smaller than a peak value of the signal is detected, so that resolution may be debased. In addition, a time constant of an internal rectifier is great, and thus, a great deal of time is required.

In addition, a peak detector usually receives output from a TIA disposed on the front end thereof for a short response time. Thus, a signal level is not high. Considering that an input signal current is at between tens of uA~hundreds of uA, signal amplitude that the peak detector has to detect needs to be very small within a range of hundreds of uV~tens of mV. Under the environment where electric noise of the digital system exists, an extraction value obtained by detecting a signal of a small output level is only half a level of the aforementioned preamble signal, so that a discriminatory capability of the peak detector may become further deteriorated. Thus, it is hard to apply the conventional structure to the multi-Gbps optical communication system.

The third problem is that the aforementioned configuration is hard to cope with change of temperature or a processing parameter under the environment where resolution is debased and digital noise exists. Thus, there is need for an alternative for stably detecting a peak value although temperature or a processing parameter is changed. Furthermore, an integrated diode occupies more space, and a process for a high-frequency diode, such as a schottky barrier diode, needs to be supported for high-speed operations.

SUMMARY

The following description relates to a signal level detector having a structure optimized for an integrated circuit and configured to extract an accurate level of a signal quickly so as to provide a discrimination value for controlling gain of an amplifier. In addition, the following description relates to a signal level detector that provides a stable discrimination value that does not affected by environmental changes, such as change of temperature or a processing parameter.

Furthermore, the following description relates to a Burst-Mode Trans Impedance Amplifier (BM-TIA) that is used in association with the aforementioned signal level detector to thereby enhance sensitivity of automatically controlling gain of an amplifier and operate at high speed.

In one general aspect, there is provided a signal level detector including: a level detector configured to detect peak voltage of an input voltage signal; a reference voltage generator configured to generate second reference voltage by receiving first reference voltage; a comparator configured to compare the peak voltage and the second reference voltage and output a discrimination value according to a comparison result; and a latch configured to store the differential output from the comparator, wherein the level detector and the reference voltage generator have a differential amplifier in the same structure.

The level detector may be further configured to comprise at least one first resistance unit and the reference voltage generator may be further configured to comprise at least one second resistance unit, and the at least one first resistance unit and the at least one second resistance unit may have an identical value.

The level detector may be further configured to comprise the differential amplifier and a Low Pass Filter (LPF) to receive an output signal from the differential amplifier, stabilize the output signal, and transmit the output signal to the comparator.

The level detector may be further configured to receive an output voltage from a Trans Impedance Amplifier (TIA), and receive the first reference voltage from a dummy TIA.

In order to detect an upper peak level, the differential amplifier in the level detector may be further configured to receive the output voltage from the TIA through a positive input node and the first reference voltage from the dummy TIA through a negative input node, and generate positive output voltage by comparing and amplifying a differential value between the output voltage and the first reference voltage.

In order to detect a lower bottom level, the differential amplifier in the level detector may be further configured to receive the output voltage from the TIA through a negative input node and the first reference voltage from the dummy TIA through a positive input node, and generate positive output voltage by comparing and amplifying a differential value between the output voltage and the first reference voltage.

The second reference voltage of the reference voltage generator may be a replica bias voltage outputted from the replica circuit of the differential amplifier in the level detector, wherein the input node of the replica circuit is connected to output of the dummy TIA without input nodes.

The latch may be further configured to provide time synchronization of the output from the comparator in accordance with a reset signal.

In another general aspect, there is provided a Burst-Mode Trans Impedance Amplifier (BM-TIA) including: a Trans Impedance Amplifier (TIA) configured to convert a received current signal into a voltage signal and amplify the voltage signal; a single to differential (S2D) amplifier configured to convert a single voltage signal output from the TIA into a first differential signal and amplify the single signal; Auto Offset Cancellation (AOC) amplifiers configured to amplify the first differential signal without a DC offset and output a second differential signal by removing the DC offset from the first differential signal; a buffer amplifier configured to amplify the received second differential signal and to output a third differential output signal; and a signal level detector comprising: a level detector configured to detect peak voltage of an input voltage signal; a reference voltage generator configured to generate second reference voltage by receiving first reference voltage; a comparator configured to compare the peak voltage and the second reference voltage and output a discrimination value according to a comparison result; and a latch configured to store the differential output from the comparator, wherein the level detector and the reference voltage generator have a differential amplifier in the same structure.

The level detector is further configured to comprise the differential amplifier and a Low Pass Filter (LPF) to receive an output signal from the differential amplifier, stabilize the output signal, and transmit the output signal to the comparator; wherein a reference voltage generator is further configured to comprise only a differential amplifier which is a replica circuit of the differential amplifier of the level detector; wherein the two identical differential amplifier of the signal level detector may have resistance units, respectively, and the resistance units have an identical value.

The signal level detector may be further configured to transmit an output signal to the TIA and the dummy TIA as a control signal for controlling gain of the TIA and the dummy TIA and, if necessary, as a control signal for controlling gain of at least one of the S2D amplifier, the AOC amplifier, or the buffer amplifier.

The signal level detector may detect a signal level in multiple stages, and the output signal of the signal level detector may be of n—the number of bits so as to control the gain in multiple stages.

The signal level detector may be further configured to receive output voltage from the TIA, receive first reference voltage from the dummy TIA, detect peak voltage of the output voltage, generate second reference voltage from the first reference voltage, compare the peak voltage and the second voltage, and generate a differential according to a comparison result.

Other features and aspects may be apparent from the following detailed description, the drawings, and the claims.

Figure 1:
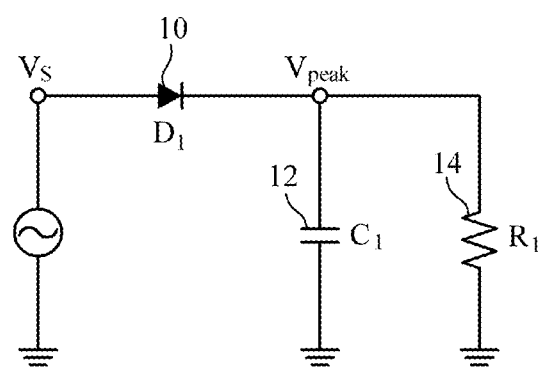
FIG. 1 is a diagram illustrating a configuration of a general rectifier using a passive device.
Figure 2:
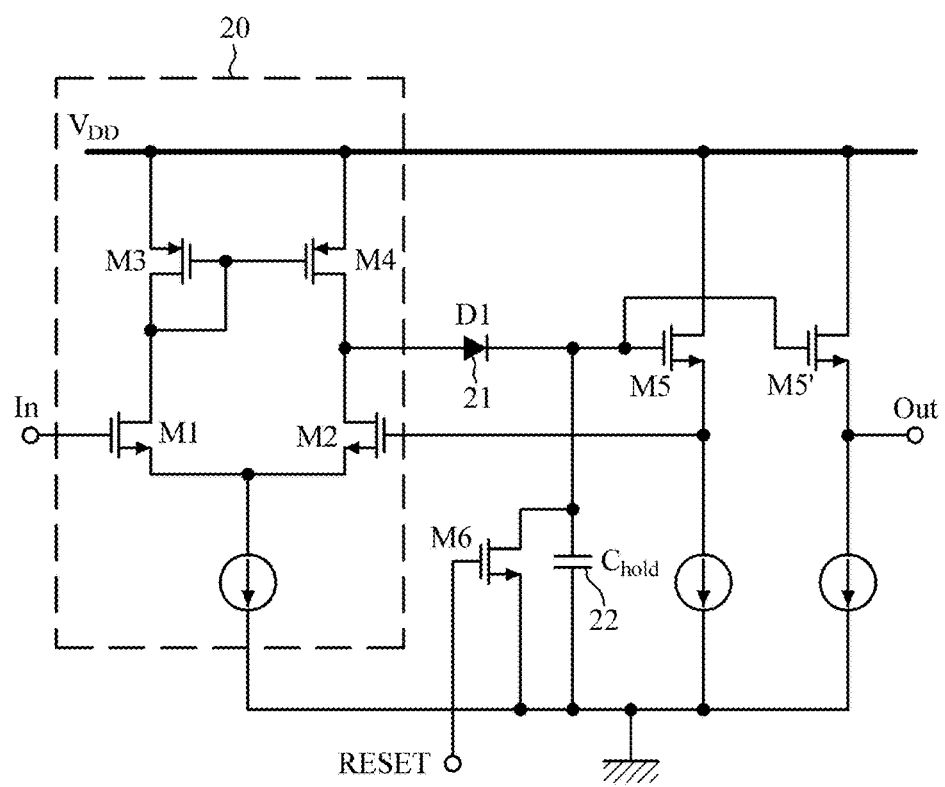
FIG. 2 is a diagram illustrating a configuration of a general peak detector used in an integrated circuit for high-speed data processing.
Figure 3:
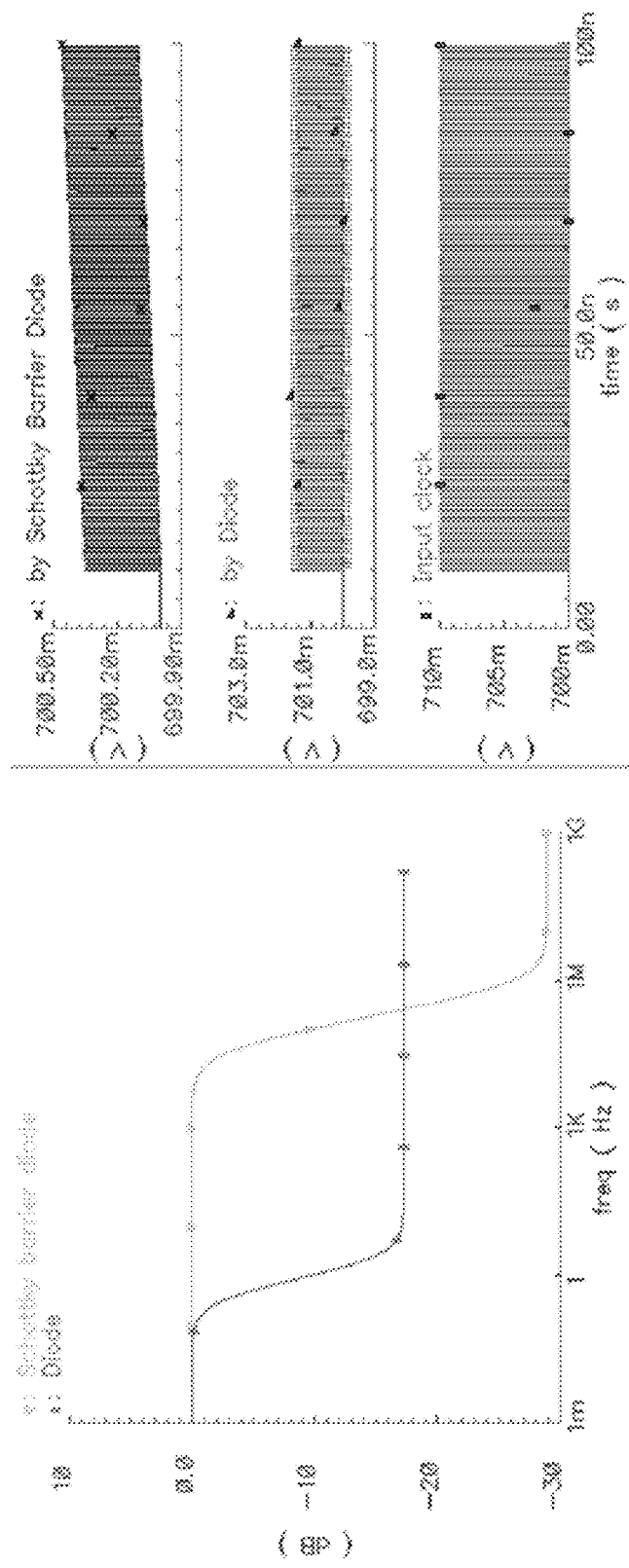
FIG. 3 is a simulation result graph regarding comparison a frequency characteristic and a transient characteristic in a case where a rectifier consists of a general diode used in an integrated circuit and a schottky barrier diode.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

Figure 4:
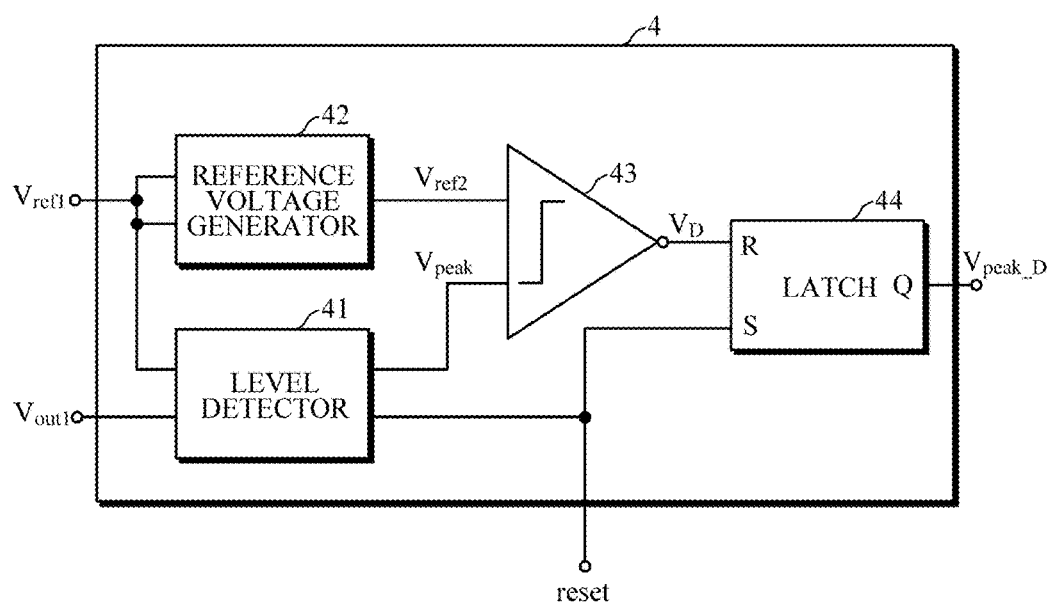
FIG. 4 is a block diagram illustrating a signal level detector according to an exemplary embodiment.

FIG. 4 is a block diagram illustrating a signal level detector according to an exemplary embodiment of the present disclosure.

Referring to FIG. 4, a signal level detector 4 includes a level detector 41, a reference voltage generator 42, a comparator 43, and a latch 44.

The level detector 41 amplifies an input signal and detects a signal level of the amplified signal. The level detector 41 receives output voltage $V_{out1}$, which is a signal output through a Photo Diode (PD) from a Trans Impedance Amplifier (TIA), as an input signal. Then, the level detector 41 detects a peak voltage value $V_{peak}$ of the output voltage $V_{out1}$, and transmits the peak voltage $V_{peak}$ to the comparator 43.

The reference voltage generator 12 generates the second reference voltage $V_{ref2}$ by receiving the first reference voltage $V_{ref1}$. The first reference voltage $V_{ref1}$ is DC voltage. The first reference voltage $V_{ref1}$ may be received from a dummy TIA in the same structure as that of the aforementioned TIA, or may be received by extracting only a DC value from an input signal. The second reference voltage $V_{ref2}$ is reference voltage that is used to determine whether a signal level of peak voltage $V_{peak}$ output from the level detector is a loud signal or a soft signal. The second reference voltage $V_{ref2}$ is used as a criterion to determine whether to control the gain of a Bust-Mode Trans Impedance Amplifier (BM-TIA) described in conjunction with FIG. 7.

The comparator 43 receives peak voltage $V_{peak}$ output from the level detector 41 and the second reference voltage $V_{ref2}$ output from the reference voltage generator 42, compares the peak voltage $V_{peak}$ and the second reference voltage $V_{ref2}$, and transmits, to the latch 44, a discrimination value $V_D$ obtained from a comparison result. In one embodiment, the comparator 43 compares the two input voltage $V_{peak}$ and $V_{ref2}$ to see if the peak voltage $V_{peak}$ is greater than the second reference voltage $V_{ref2}$, and outputs a discrimination value $V_D$ to the latch 44.

The latch 44, in the same structure as that of an SR latch, receives a one-bit discrimination value $V_D$ from the comparator 43 and stores the received discrimination value $V_D$. At this point, the latch 44 provides time synchronization to the discrimination value $V_D$ in accordance with a reset signal received from a Medium Access Control (MAC) layer. The latch 44 retains an existing value before a reset signal is received, and thus, once a value is reset, the latch 44 retains the reset value until the next reset signal occurs. In other words, if a signal is input to S of the latch 44, an output value Q is 1, and, if a signal is input to R of the latch 44, an output value Q is 0. In this case, a reset signal input to S retains a value of 1 for a predetermined period of time, the output value Q is HIGH at an initial stage. Then, if a one-bit discrimination value $V_D$ input to R is 1 by detecting a loud signal, the output value Q is kept to be LOW. The Low value is maintained until a reset signal is input once again.

Since a signal input to a BM-TIA is a serial packet mixed with loud and soft signals coming from various Optical Network Units (ONUs), a guard time exists in each packet to distinguish the load and soft signals. A reset signal exists in the guard time to initialize the system to a high gain state and then prepare to receive the next burst packet signal. Once a reset signal occurs, a discrimination value $V_D$ stored in the latch 44 is initialized and stored later in accordance with size of a burst packet signal that is received the next time. Circuit configuration of the system determines whether High value (1) or Low value (0) is to be a loud signal.

If the peak voltage $V_{peak}$ is greater than the second reference voltage $V_{ref2}$, the latch 44 attenuates the gain of the TIA through a feedback signal. By contrast, if the peak voltage $V_{peak}$ is smaller than the second reference voltage $V_{ref2}$, the latch 44 retains the high gain of the TIA.

Figure 5:
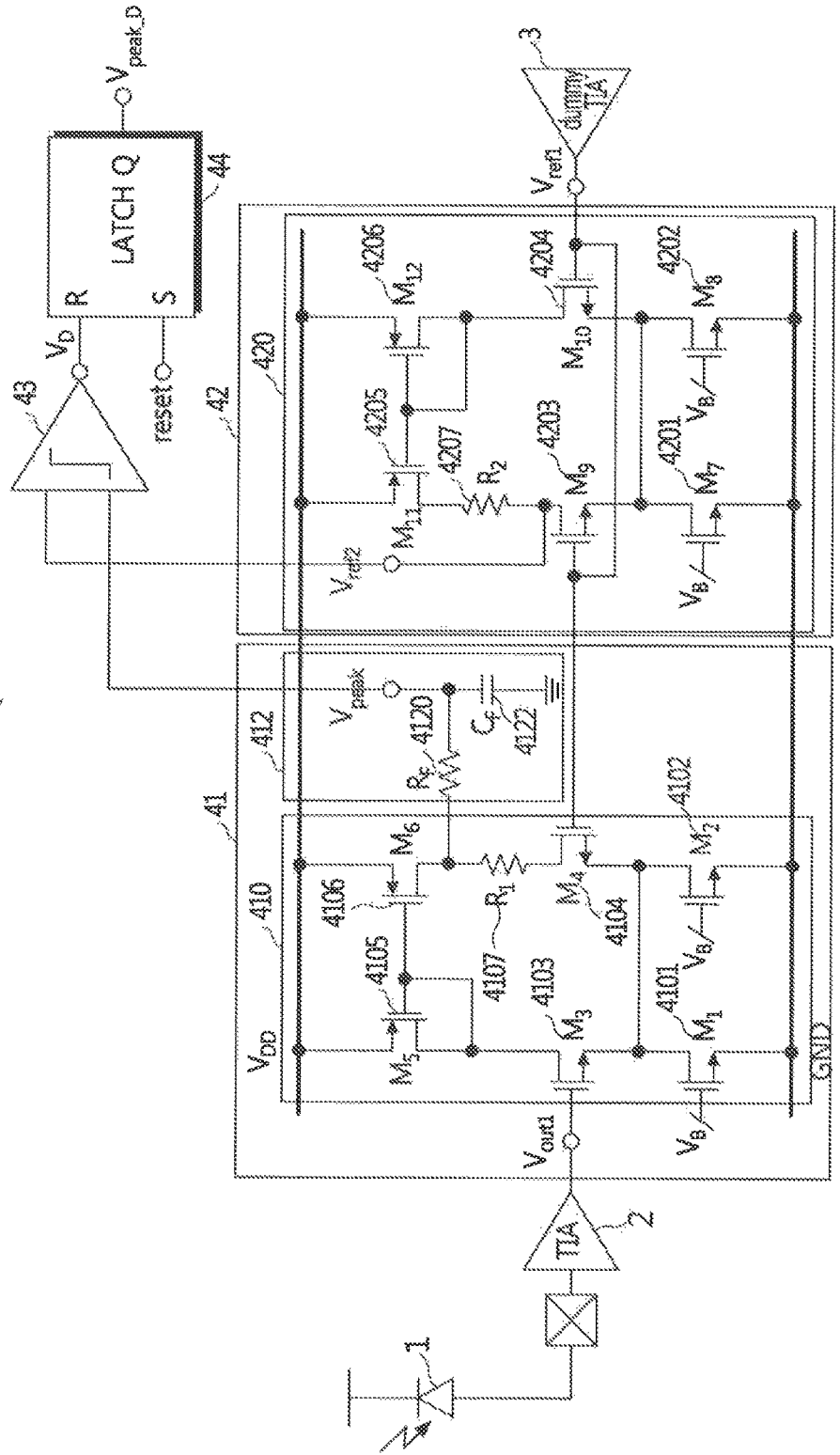
FIG. 5 is a circuit diagram illustrating a signal level detector according to an exemplary embodiment.

FIG. 5 is a circuit diagram of a level detector according to an exemplary embodiment of the present disclosure.

FIG. 5 shows mainly a level detector and a reference generator of a level detector 4 proposed by the present disclosure.

Referring to FIG. 5, the level detector 41 includes the first differential amplifier 410, and may further include a Low Pass Filter (LPF) 412. The reference voltage generator 42 includes the second differential amplifier 420. The first differential amplifier 410 of the level detector 41 and the second differential amplifier 420 of the reference voltage generator 42 are identical in configuration and size. Thus, although temperature or a processing parameter is changed, the first and second differential amplifiers 410 and 420 may have the same operation characteristics.

The level detector 41 including the first differential amplifier 410 has a differential input and a single output. That is, the level detector 41 receives, through a positive node, output voltage $V_{out1}$ from a TIA 2, and, through a negative node, the first reference voltage Vref1 that is voltage output from a dummy TIA 3. Then, the level detector 41 amplifies differential between the output voltage $V_{out1}$ and the first reference voltage $V_{ref1}$ to be as great as gain of the first deferential amplifier 410, and outputs peak voltage $V_{peak}$.

In the present disclosure, in order to detect a positive peak value, the first differential amplifier 410 receives the output voltage $V_{out1}$ through a positive input node and the first reference voltage $V_{ref1}$ through a negative input node. Then, the first differential amplifier 410 generates positive output voltage by amplifying a differential between the output voltage $V_{out1}$ and the first reference voltage $V_{ref1}$. Similarly, in order to detect a negative peak value, the first differential amplifier 410 receives the output voltage $V_{out1}$ through a positive input node, and the first reference voltage $V_{ref1}$ through a negative input node. Then, the first differential amplifier 410 generates negative output voltage by amplifying a differential between the output voltage $V_{out1}$ and the first reference voltage $V_{ref1}$.

An LPF 412 consisting of a resistance RF 4120 and a capacitor CF 4122 is connected to an output node of the first differential amplifier 410. The LPF 412 stabilizes a peak voltage $V_{peak}$ by filtering voltage output from the first differential amplifier 410. Then, the LPF 412 transmits the filtered peak voltage $V_{peak}$ to the comparator. In this case, values of the resistance RF 4120 and the capacitor CF 4122 included in the LPF 412 may a value that is used to determine −3 dB which is a bandwidth of the LPF 412, and a value that enables quick response to detection of a multi-Gbps optical level.

The second differential amplifier 420 of the reference voltage generator 42 and the first differential amplifier 410 of the level detector 41 are identical in configuration. However, both of a positive node and a negative node of the second differential amplifier 420 receive the reference voltage $V_{ref1}$ output from the dummy TIA 3, and then generates and outputs the second reference voltage $V_{ref2}$. For example, the reference voltage generator 42 receives, as a differential, the reference voltage $V_{ref1}$ output from the dummy TIA 3. In addition, the reference voltage generator 42 outputs drain voltage from a transistor M9 4203, not drain voltage from a transistor M11 4205. This process aims to generate the second reference voltage $V_{ref2}$ that determines whether a signal level is loud or not, and the second reference voltage $V_{ref2}$ is smaller than peak voltage $V_{peak}$ that does not carry a signal.

The following description provided in conjunction with FIG. 5 assumes a negative amplifier with phase where output from the TIA 2 is to be inversed. Thus, in the case of a positive amplifier, locations of the peak voltage $V_{peak}$ and the second reference voltage $V_{ref2}$ needs to be changed to each other.

Although the level detector 41 and the reference voltage generator 42 use differential amplifiers 410 and 420 in the same structure, a resistance R1 4107 of the level detector 41 and a resistance R2 4207 of the reference voltage generator 42 needs to have a more identical resistance value. It is because the two differential amplifiers 410 and 420 are under the same operational environment so it needs to retain a constant relative voltage differential that is never changed even in the case where temperature or a processing parameter is changed. Due to the aforementioned configuration, a point of inflection of gain controlling is not changed. Thus, the second reference voltage $V_{ref2}$ may be considered replica bias voltage without a signal applied from the level detector 41.

The second reference voltage $V_{ref2}$ and the peak voltage $V_{peak}$ are input to the comparator 43, and the comparator 43 compares the peak voltage $V_{peak}$ and the second reference voltage $V_{ref2}$ to see if the peak voltage $V_{peak}$ is greater than the second reference voltage $V_{ref2}$. In the aforementioned configuration, the peak voltage $V_{peak}$ is greater than the second reference voltage $V_{ref2}$ when a loud bust signal is input, and the peak $V_{peak}$ is smaller than the second reference voltage $V_{ref2}$ when a soft bust signal is input. According to an exemplary embodiment, the comparator 43 outputs High (1) as a discrimination value $V_D$ in the case where the peak voltage $V_{peak}$ is greater than the second reference voltage $V_{ref2}$, and outputs Low(0) as a discrimination value $V_D$ in the case where the peak voltage $V_{peak}$ is smaller than the second reference voltage $V_{ref2}$.

For multi-stage gain controlling, a plurality of serial resistances, instead of the resistance R1 4107 and the resistance R2 4207, are inserted into each of the two differential amplifiers 410 and 420, comparison reference voltage values are detected from each resistance, and a plurality of comparators compare the detected comparison reference voltage values compared with one another.

Hereinafter, a configuration of the first differential amplifier 410 of the level detector 41 is described in detail with reference to FIG. 5.

The first differential amplifier 410 amplifies voltage $V_{in}$ input to a positive input node so as to generate positive output voltage. The first differential amplifier 410 includes power voltage VDD, ground voltage GND, the first transistor $M_1$ 4101, the second transistor $M_2$ 4102, the third transistor $M_3$ 4103, the fourth transistor $M_4$ 4104, the fifth transistor $M_5$ 4105, and the sixth transistor $M_6$ 4106.

The first transistor $M_1$ 4101 is configured in a manner in which a source is connected to the ground voltage GND, a drain is connected to the third transistor $M_3$ 4103, and bias voltage $V_B$ is input to a gate. The second transistor $M_2$ 4102 is configured in a manner in which a source is connected to the ground voltage GND, a drain is connected to the fourth transistor $M_4$ 4104, and bias voltage $V_B$ is input to a gate. The drain of the first transistor $M_1$ 4101 and the drain of the second transistor $M_2$ 4102 are connected to each other.

The third transistor $M_3$ 4103 is configured in a manner in which a source is connected to the first transistor $M_1$ 4101, a drain is connected to the fifth transistor $M_5$ 4105, a gate is connected to a positive input node to receive output voltage $V_{out1}$. The fourth transistor $M_4$ 4104 is configured in a manner in which a source is connected to the second transistor $M_2$ 4102, a drain is connected to the sixth transistor $M_6$ 4106, and a gate is connected to a negative input node so as to receive the first reference voltage $V_{ref1}$. The source of the third transistor $M_3$ 4103 and the source of the fourth transistor $M_4$ 4104 are connected to each other.

The fifth transistor $M_5$ 4105 is configured in a manner in which a source is connected to the power voltage VDD, a drain is connected to the third transistor $M_3$ 4103, a gate is connected to the sixth transistor $M_6$ 4106. The sixth transistor is configured in a manner in which a source is connected to the power voltage VDD, a drain is connected to the fourth transistor $M_4$ 4104, and a gate is connected to the fifth transistor $M_5$ 4105.

An output node for outputting output voltage is formed in the drain of the sixth transistor $M_6$ 4106. In addition, the resistance $R_1$ 4107 is formed between the fourth transistor $M_4$ 4104 and the output node. However, the circuit configuration described above is merely exemplary, and aspects of the present disclosure are not limited thereto.

Hereinafter, the reference voltage generator 42 and the second differential amplifier 420 are described in detail with reference to FIG. 5.

The second differential amplifier 420 includes power voltage VDD, ground voltage GND, the seventh transistor $M_7$ 4201, the eighth transistor $M_8$ 4202, the ninth transistor $M_9$ 4203, the tenth transistor $M_{10}$ 4204, the eleventh transistor $M_{11}$ 4205, and the twelfth transistor $M_{12}$ 4206.

The seventh transistor $M_7$ 4201 is configured in a manner in which a source is connected to the ground voltage GND, a drain is connected to the ninth transistor $M_9$ 4203, and bias voltage $V_B$ is input to a gate. The eighth transistor $M_8$ 4202 is configured in which a source is connected to the ground voltage GND, a drain is connected to the tenth transistor $M_{10}$ 4204, and bias voltage $V_B$ is input to a gate. The drain of the seventh transistor $M_7$ 4201 and the drain of the eighth transistor $M_8$ 4202 are connected to each other.

The ninth transistor $M_9$ 4203 is configured in a manner in which a source is connected to the seventh transistor $M_7$ 4201, a drain is connected to the eleventh transistor $M_{11}$ 4205, and a gate is connected to a positive input node so as to receive the first reference voltage $V_{ref1}$. The tenth transistor $M_{10}$ 4204 is configured in a manner in which a source is connected to the eighth transistor $M_8$ 4202, a drain is connected to the twelfth transistor $M_{12}$ 4206, and a gate is connected to a negative input node so as to receive the first reference voltage $V_{ref1}$. The source of the ninth transistor $M_9$ 4203 and the source of the tenth transistor $M_{10}$ 4204 are connected to each other.

The eleventh transistor $M_{11}$ 4205 is configured in a manner in which a source is connected to the power voltage VDD, a drain is connected to the ninth transistor $M_8$ 4203, and a gate is connected to the twelfth transistor $M_{12}$ 4206. The twelfth transistor $M_{12}$ 4206 is configured in a manner in which a source is connected to the power voltage, a drain is connected to the tenth transistor $M_{10}$ 4204, and a gate is connected to the eleventh transistor $M_{11}$ 4205.

An output node for outputting output voltage is formed in the drain of the ninth transistor $M_9$ 4203. In addition, the resistance $R_2$ 4207 is formed between the eleventh transistor $M_{11}$ 4205 and the output node. However, the circuit configuration described above is merely exemplary, and aspects of the present disclosure are not limited thereto.

Figure 6:
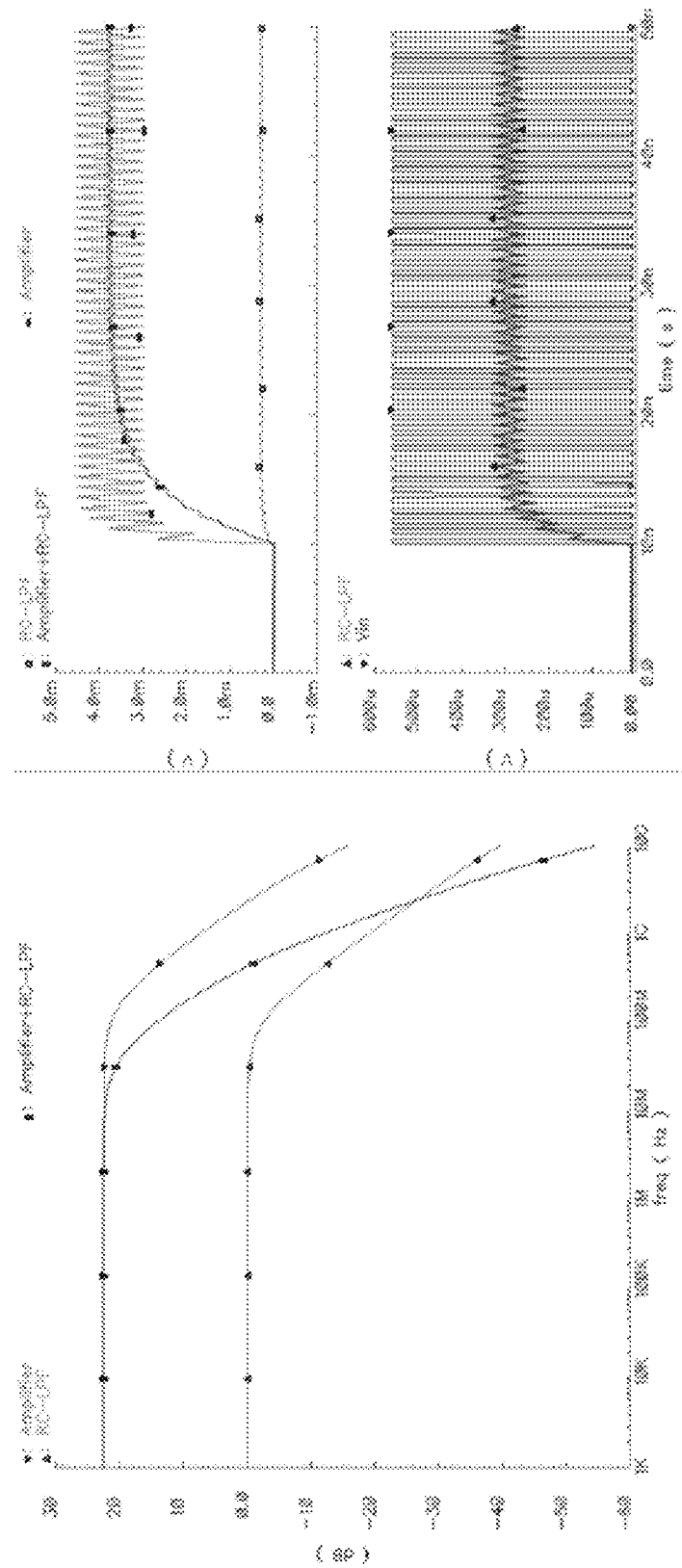
FIG. 6 is a simulation result graph showing effects of a signal level detector including an amplifier and a Low Pass Filter (LPF) according to an exemplary embodiment.

FIG. 6 is a simulation result graph that shows effects of a signal level detector that includes an amplifier and an LPF according to an exemplary embodiment of the present disclosure.

An RC-LPF has a broadband frequency characteristic, compared to a detector that consists of a diode and a capacitor.

As shown in the bottom right graph in FIG. 6, an RC-LPF has a relatively decent signal transient characteristic within 5 ns with respect to a preamble input signal. However, due to zero gain and a charging/discharging state, amplitude of a detected voltage is not as great as amplitude of a preamble input signal and has only half a transient characteristic of a level of the preamble input signal. In this case, resolution to be discriminated becomes debased, and thus, the RC-LPF cannot not be used for a multi-Gbps TIA without an amplifier.

An amplifier itself, without an RC-LPF, basically acts as an LPF, so if the amplifier is set to have a frequency characteristic similar to that of the RC-LPF, the amplifier is able to have a decent signal transient characteristic within 5 ns. However, not just an input signal, but a level of an unnecessary AC ripple signal is amplified in the amplifier, so that a detection signal fluctuates violently more than a result of the RC-LPF and thus the amplifier may not provide a stable output value. As a result, a discrimination value may be unstable, and thus, the amplifier cannot be used for a multi-Gbps TIA without the RC-LPF.

As shown in the top right graph, if an RC-LPF and an amplifier are used together, 15 ns transient characteristic, a more stable peak value, and a more discriminant value may be achieved, and thus, the RC-LPF and the amplifier can be used for a multi-Gbps TIA.

Figure 7:
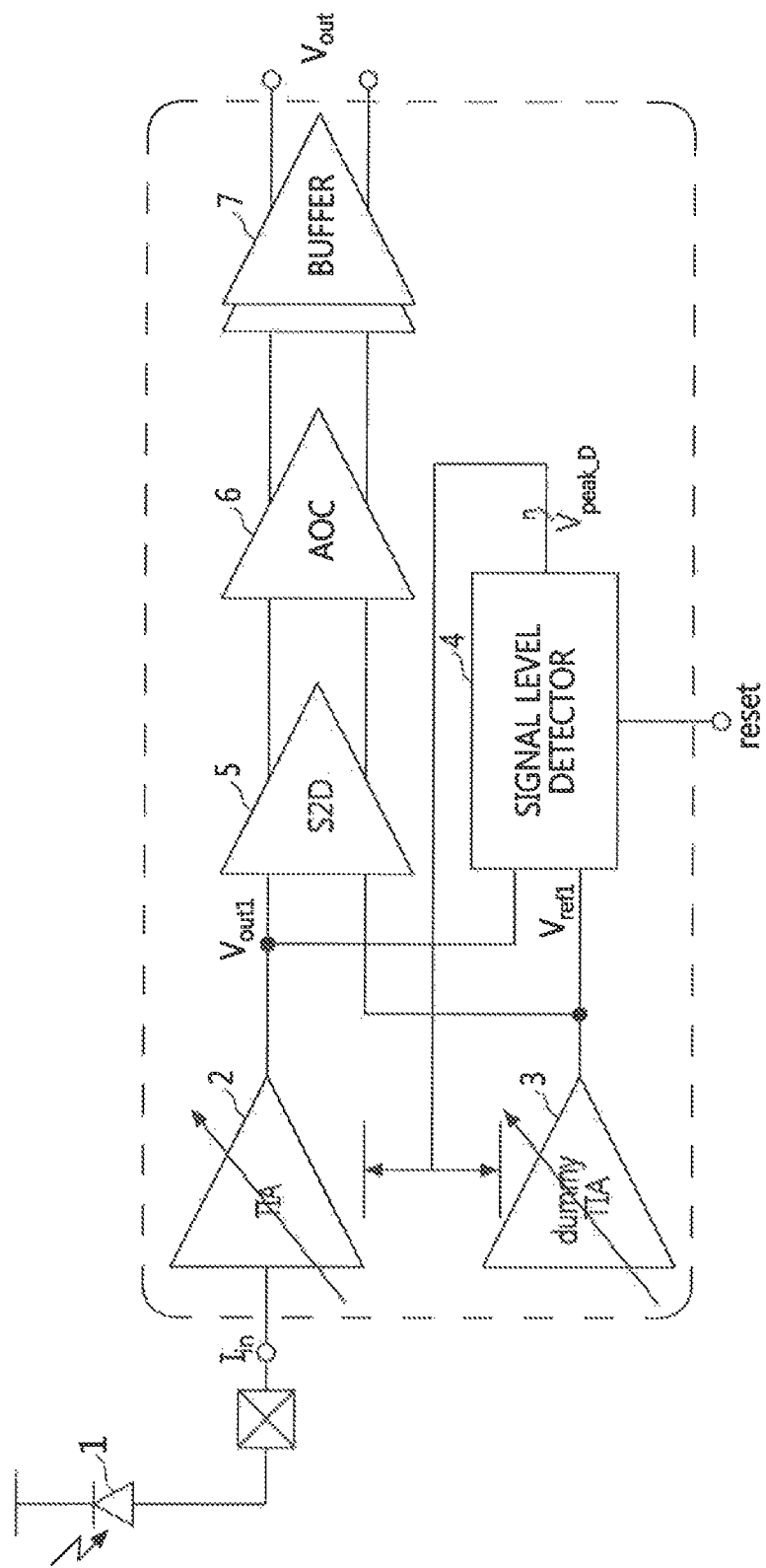
FIG. 7 is a diagram illustrating a Burst-Mode Trans Impedance Amplifier (BM-TIA) including a signal level detector according to an exemplary embodiment.

FIG. 7 is a diagram illustrating a configuration of a BM-TIA including a signal level detector according to an exemplary embodiment of the present disclosure.

Referring to FIG. 7, a BM-TIA according to an exemplary embodiment includes a TIA 2, a dummy TIA 3, a signal level detector 4, a Single to Differential (S2D) amplifier 5, an Auto Offset Cancellation (AOC) amplifier 6, and a buffer amplifier 7.

The TIA 2 outputs output voltage $V_{out1}$ by converting and amplifying an input current signal $I_{in}$ received from the outside. The input current signal $I_{in}$ received by the TIA 2 may be a signal received from a photo diode (PD) 1 through optical fibers. The S2D amplifier 5 outputs the first differential signal by converting and amplifying an output voltage signal $V_{out1}$. The AOC amplifier 6 removes a DC-offset from the first differential signal for stabilization of a circuit, generates the second differential signal by amplifying the first differential signal where the DC-offset has been removed, and outputs the second differential signal. The buffer amplifier 7 receives the second differential signal and outputs a differential output signal to an external device.

The signal level detector 4 receives the output voltage signal $V_{out1}$ from the TIA 2, detects a level of the output voltage signal $V_{out1}$, and outputs an output signal $V_{peak\_D}$ by receiving and using the first reference voltage $V_{ref1}$ which is a reference value.

The dummy TIA 3 has the same structure as that of the TIA 2, but no signal is applied the dummy TIA 3. The dummy TIA 3 is used for extracting an identical DC value in the case where a signal is applied and there is no signal to a TIA. An output DC value of the dummy TIA 3 is input to the signal level detector 4 and the S2D amplifier 5 as the first reference voltage $V_{ref1}$.

The use of the first reference voltage $V_{ref1}$ in the signal level detector 4 is described above with reference to FIGS. 4 and 5, so detailed descriptions thereof is not provided hereinafter. When converting a single output voltage signal $V_{out1}$ into a differential signal by using the first reference voltage $V_{ref1}$, the S2D amplifier 5 may use the output voltage signal $V_{out1}$ as a signal of a differential input. That is, the output voltage $V_{out1}$ is input to one differential port of the S2D amplifier 5, and the first reference voltage $V_{ref1}$ is input to the other differential port thereof.

A signal level detected by the signal level detector 4 may is provided to the TIA 2 and the dummy TIA 3 through the output signal $V_{peak\_D}$ so as to control voltage gain of an amplifier. Controlling gain of an amplifier is not necessarily limited to the TIA 2 and the dummy TIA 3, and may be applied to other blocks, for example, the S2D amplifier 5, the AOC amplifier 6, and the buffer amplifier 7.

Figure 8:
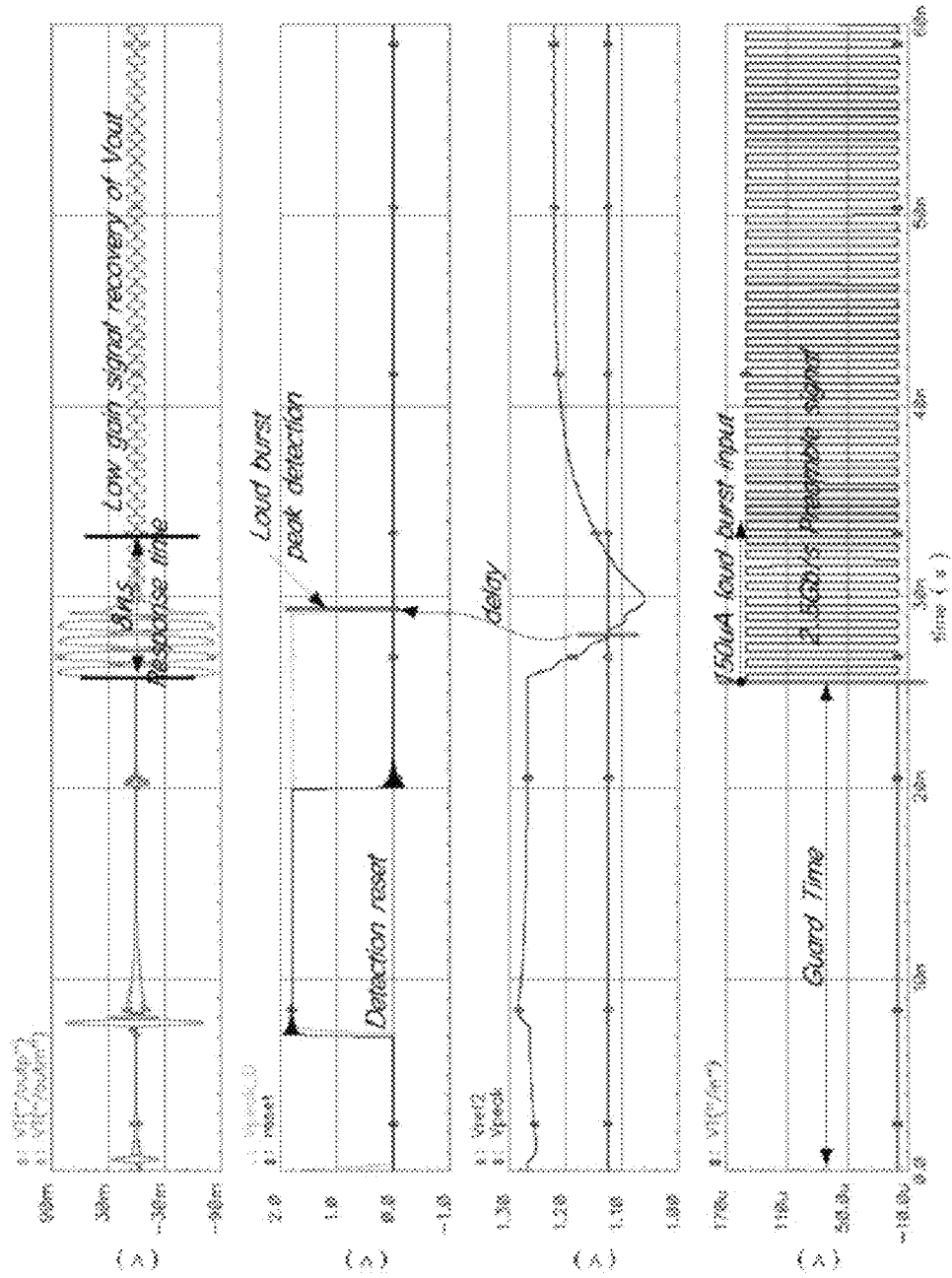
FIG. 8 is a waveform diagram illustrating a simulation waveform of a BM-TIA according to an exemplary embodiment.

FIG. 8 is a waveform diagram illustrating a simulation waveform of a BM-TIA according to an exemplary embodiment of the present disclosure.

Specifically, FIG. 8 shows a simulation waveform that occurs in the assumption that a preamble signal of 2.5 Gb/s in a loud burst input signal with amplitude 150 uA is applied as an input signal. If a reset signal is applied on the MAC layer during a guard time, a signal level detector resets detection and outputs a High value. If a preamble signal is input, a signal which was initially amplified through an output buffer is output.

However, in the case where the signal level detector compares the second reference voltage $V_{ref2}$ and the peak voltage $V_{peak}$, if the peak voltage $V_{peak}$ is smaller than the second reference voltage $V_{ref2}$, the signal level detector outputs a Low value as $V_{peak\_D}$. $V_{peak\_D}$ is provided to a TIA to control gain. Thus, after the gain is adjusted, a signal voltage with small amplitude gain is output through a buffer. Accordingly, if a loud burst current input is applied, the signal level detector automatically recognizes the load burst current input, and then outputs the same by reducing gain thereof to avoid non-linear amplification.

Response time refers to a period of time where gain of an initial output voltage is adjusted to obtain a new stable output value. In this simulation, the response time is 8 ns. The response time is an important value required for a system, so it needs to be considered when designing the system. The longer the response time, the smaller a data throughput is.

A signal level detector according to an exemplary embodiment is able to detect a peak value of a signal at a high speed, stably, and precisely although temperature or a processing parameter is changed. In addition, the signal level detector does not use a diode, thereby resulting in a high integration rate and economic processing costs.

Furthermore, since the signal level detector is used in association with a BM-TIA, response time may be reduced and sensitivity for automatically controlling gain of an amplifier may be enhanced.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A signal level detector comprising:
 a level detector configured to detect peak voltage of an input voltage signal,
 wherein the level detector comprises a first differential amplifier and a low pass filter,
 wherein the first differential amplifier comprises a first transistor, a second transistor, a third transistor, a fourth transistor, a fifth transistor, a sixth transistor and a first resistor,
 wherein the first transistor comprises a source connected to a ground voltage, a drain connected to a source of the third transistor and a drain of the second transistor, and a gate connected to a bias voltage,
 wherein the second transistor comprises a source connected to the ground voltage, a drain connected to a source of the fourth transistor and the drain of the first transistor, and a gate connected to the bias voltage,
 wherein the third transistor comprises a source connected to the first transistor, a drain connected to a drain and a gate of the fifth transistor, and a gate connected to a positive input node to receive a signal,
 wherein the fourth transistor comprises a source connected to the second transistor, a drain connected to the first resistor, and a gate connected to a negative input node to receive a first reference voltage,
 wherein the fifth transistor comprises a source connected to a power voltage, a gate connected to the sixth transistor, and a drain connected to the gate and the third transistor,
 wherein the sixth transistor comprises a source connected to the power voltage, a drain connected to the first resistor, and a gate connected to the fifth transistor,
 wherein the first resistor is configured to connect the fourth transistor and the sixth transistor;

a reference voltage generator configured to generate second reference voltage by receiving the first reference voltage, wherein the reference voltage generator comprises a second differential amplifier;
 a comparator configured to compare the peak voltage and the second reference voltage and output a discrimination value according to a comparison result; and
 a latch configured to store the differential output from the comparator,
 wherein the first differential amplifier of the level detector and the second differential amplifier of the reference voltage generator are identical circuits to have same operation characteristics regardless of changing temperature or a processing parameter.

2. The signal level detector of claim 1, wherein, in order to detect a positive peak level, the level detector receives a signal voltage to be detected at the positive input node, receives the first reference voltage at the negative input node, and generates a positive output voltage by comparing and amplifying a differential value between the output voltage and the first reference voltage.

3. The signal level detector of claim 1, wherein, in order to detect a negative peak level, the level detector receives a signal voltage to be detected at the negative input node, receives the first reference voltage at the positive input node, and generates a positive output voltage by comparing and amplifying a differential value between the output voltage and the first reference voltage.

4. A Burst-Mode Trans Impedance Amplifier (BM-TIA) comprising:
 a Trans Impedance Amplifier (TIA) configured to convert a received current signal into a voltage signal and amplify the voltage signal;
 a single to differential (S2D) amplifier configured to convert a single voltage signal output from the TIA into a first differential signal and amplify the single signal;
 Auto Offset Cancellation (AOC) amplifiers configured to amplify the first differential signal without a DC offset and output a second differential signal by removing the DC offset from the first differential signal;
 a buffer amplifier configured to amplify the received second differential signal and to output a third differential output signal; and
 a signal level detector comprising:
  a level detector configured to detect peak voltage of an input voltage signal,
  wherein the level detector comprises a first differential amplifier and a low pass filter,
  wherein the first differential amplifier comprises a first transistor, a second transistor, a third transistor, a fourth transistor, a fifth transistor, a sixth transistor and a first resistor,
  wherein the first transistor comprises a source connected to a ground voltage, a drain connected to a source of the third transistor and a drain of the second transistor, and a gate connected to a bias voltage,
  wherein the second transistor comprises a source connected to the ground voltage, a drain connected to a source of the fourth transistor and the drain of the first transistor, and a gate connected to the bias voltage,
  wherein the third transistor comprises a source connected to the first transistor, a drain connected to a drain and a gate of the fifth transistor, and a gate connected to a positive input node to receive a signal, wherein the fourth transistor comprises a source connected to the second transistor, a drain connected to the first resistor, and a gate connected to a negative input node to receive a first reference voltage, wherein the fifth transistor comprises a source connected to a power voltage, a gate connected to the sixth transistor, and a drain connected to the gate and the third transistor, wherein the sixth transistor comprises a source connected to the power voltage, a drain connected to the first resistor, and a gate connected to the fifth transistor, wherein the first resistor is configured to connect the fourth transistor and the sixth transistor;

a reference voltage generator configured to generate second reference voltage by receiving the first reference voltage, wherein the reference voltage generator comprises a second differential amplifier;

a comparator configured to compare the peak voltage and the second reference voltage and output a discrimination value according to a comparison result; and a latch configured to store the differential output from the comparator, wherein the first differential amplifier of the level detector and the second differential amplifier of the reference voltage generator are identical circuits to have same operation characteristics regardless of changing temperature or a processing parameter.

5. The BM-TIA of claim 4, wherein the signal level detector is further configured to transmit an output signal to the TIA and the dummy TIA as a control signal for controlling gain of the TIA and the dummy TIA and, if necessary, as a control signal for controlling gain of at least one of the S2D amplifier, the AOC amplifier, or the buffer amplifier.

6. The BM-TIA of claim 5, wherein the signal level detector detects a signal level in multiple stages, and the output signal of the signal level detector is of n–the number of bits so as to control the gain in multiple stages.

7. The BM-TIA of claim 4, wherein the signal level detector is further configured to receive output voltage from the TIA, receive the first reference voltage from the dummy TIA, detect peak voltage of the output voltage, generate a second reference voltage from the first reference voltage, compare the peak voltage and the second voltage, and generate a differential according to a comparison result.

8. The signal level detector of claim 1, wherein the first differential amplifier of the level detector is formed with an output node between the sixth transistor and the first resistor, wherein the second differential amplifier of the reference voltage generator is formed with an output node between the fourth transistor and the first resistor, wherein the second reference voltage of the reference voltage generator is an output voltage generated by receiving the first reference voltage at input nodes.

9. The signal level detector of claim 1, wherein the latch receives a discrimination value output from the comparator at R node, receives a reset signal from providing the time synchronization at S node, and outputs a discrimination value (H/L) stored at Q node.

10. The BM-TIA of claim 4, wherein the level detector is further configured to receive an output voltage from a Trans Impedance Amplifier (TIA), and receive the first reference voltage from a dummy TIA.

11. The BM-TIA of claim 4, wherein the level detector is configured to receive an output voltage from a Trans Impedance Amplifier (TIA), and detect a peak voltage level, wherein the reference voltage generator is configured to receive the first reference voltage from a dummy TIA having no input signal to generate the second reference voltage, wherein the comparator is configured to receive the peak voltage level and the second reference voltage, and output a discrimination value according to the comparison result, wherein the latch is configured to store a discrimination value output from the comparator, wherein the output of the latch is configured to control a gain of the TIA and the dummy TIA.

* * * * *